US010303570B2

(12) United States Patent
Nakajima

(10) Patent No.: US 10,303,570 B2
(45) Date of Patent: May 28, 2019

(54) METHOD AND APPARATUS FOR MANAGING DATA RECOVERY OF DISTRIBUTED STORAGE SYSTEM

(71) Applicant: Hitachi, Ltd., Tokyo (JP)

(72) Inventor: Akio Nakajima, Tokyo (JP)

(73) Assignee: Hitachi, Ltd., Tokyo (JP)

( * ) Notice: Subject to any disclaimer, the term of this patent is extended or adjusted under 35 U.S.C. 154(b) by 225 days.

(21) Appl. No.: 15/317,245

(22) PCT Filed: Oct. 17, 2014

(86) PCT No.: PCT/US2014/061013
§ 371 (c)(1),
(2) Date: Dec. 8, 2016

(87) PCT Pub. No.: WO2016/060675
PCT Pub. Date: Apr. 21, 2016

(65) Prior Publication Data
US 2017/0109247 A1    Apr. 20, 2017

(51) Int. Cl.
G01R 31/28      (2006.01)
G06F 11/10      (2006.01)
(Continued)

(52) U.S. Cl.
CPC .......... *G06F 11/2069* (2013.01); *G01R 31/28* (2013.01); *G06F 11/1048* (2013.01); *G06F 11/1084* (2013.01); *G06F 11/1096* (2013.01); *G06F 11/14* (2013.01); *G06F 11/2058* (2013.01); *G06F 13/28* (2013.01); *G06F 11/3442* (2013.01); *G06F 2201/81* (2013.01);
(Continued)

(58) Field of Classification Search
CPC ............ G06F 11/1076; G06F 11/1084; G06F 11/1092; G06F 11/1096; G06F 11/2056; G06F 11/2058; G06F 11/2069; G06F 11/3442; G06F 2211/1004; G06F 3/0629
See application file for complete search history.

(56) References Cited

U.S. PATENT DOCUMENTS 5,390,327 A *  2/1995 Lubbers ............... G06F 11/1084
                                                714/6.32
5,659,704 A    8/1997 Burkes et al.
(Continued)

OTHER PUBLICATIONS

International Search Report of PCT/US2014/061013 dated Jan. 29, 2015.

*Primary Examiner* — Gabriel Chu
(74) *Attorney, Agent, or Firm* — Mattingly & Malur, PC

(57) ABSTRACT

Exemplary embodiments provide a way to manage data recovery in a distributed system having multiple data store nodes. A storage system comprises: a first node including a first processor; and a plurality of second nodes coupled to the first node, each of the plurality of second nodes including a second processor and one or more second storage devices. The first processor is configured to control to store data and replication of the data in the second storage devices of two or more second nodes. If at least one of the second nodes has failed and a storage capacity of the plurality of second nodes is below a given threshold, one of the second nodes is configured to receive a first data, which is replication of data stored in a failed second node, from another of the second nodes, and create parity data based on the received first data.

15 Claims, 18 Drawing Sheets

(51) Int. Cl.
*G06F 11/14* (2006.01)
*G06F 11/20* (2006.01)
*G06F 11/34* (2006.01)
*G06F 13/28* (2006.01)

(52) U.S. Cl.
CPC ............... *G06F 2201/845* (2013.01); *G06F 2211/1004* (2013.01)

(56) References Cited

U.S. PATENT DOCUMENTS

| | | | | |
|---|---|---|---|---|
| 6,154,853 A * | 11/2000 | Kedem | ............... | G06F 11/1084 711/114 |
| 6,275,898 B1 * | 8/2001 | DeKoning | ............ | G06F 3/0605 711/114 |
| 7,127,557 B2 * | 10/2006 | Ito | ................. | G06F 3/0614 711/114 |
| 7,308,599 B2 * | 12/2007 | Patterson | ............ | G06F 11/1092 711/114 |
| 7,778,984 B2 | 8/2010 | Zhang et al. | | |
| 7,814,273 B2 * | 10/2010 | Barrall | ................. | G06F 3/0607 711/114 |
| 8,423,735 B2 | 4/2013 | Akirav et al. | | |
| 8,738,582 B2 | 5/2014 | De Schrjver et al. | | |
| 2003/0088803 A1 * | 5/2003 | Arnott | ................. | G06F 11/10 714/5.11 |
| 2005/0182992 A1 * | 8/2005 | Land | ................. | G06F 3/0607 714/701 |
| 2007/0094574 A1 * | 4/2007 | Taguchi | ............ | G06F 11/1092 714/770 |
| 2008/0005612 A1 * | 1/2008 | Arai | ................. | G06F 11/1084 714/6.12 |
| 2009/0037656 A1 * | 2/2009 | Suetsugu | ............ | G06F 11/1092 711/114 |
| 2010/0293439 A1 * | 11/2010 | Flynn | ................. | G06F 11/073 714/763 |
| 2013/0275815 A1 | 10/2013 | De Keyser et al. | | |
| 2014/0195486 A1 | 7/2014 | Kulkarni et al. | | |
| 2014/0310489 A1 | 10/2014 | Chambliss et al. | | |
| 2015/0236725 A1 * | 8/2015 | Reinart | ................. | H03M 13/35 714/774 |
| 2015/0356005 A1 * | 12/2015 | Hayes | ................. | G06F 12/0238 711/102 |

* cited by examiner data store node table 40

| node id 41 | node condition 42 | physical capacity 43 | stored data capacity 44 | failure capacity 45 |
|---|---|---|---|---|
| 1 | healthy | 50 TB | 24 TB | 0 TB |
| 2 | healthy | 36 TB | 25 TB | 4 TB |
| 3 | healthy | 34 TB | 27 TB | 16 TB |
| 4 | failure | 0 TB | 0 TB | 50 TB |
| 5 | healthy | 40 TB | 34 TB | 10 TB |
| ... | ... | ... | ... | ... |

FIG. 4 replication data layout table 50

| object id (51) | destination node id (52) | coding mode (53) | replication mode (54) |
|---|---|---|---|
| 0103 | 1 | parity 2 | data |
| 0203 | 2 | parity 2 | mirror 1 |
| 1033 | 3 | parity 2 | data |
| 3522 | 1 | parity 3 | mirror 2 |
| 4332 | 2 | parity 4 | mirror 1 |
| ... | ... | ... | ... |

FIG. 5

| data layout table 60 | | |
|---|---|---|
| object id `61` | HDD id `62` | location address `63` |
| 0001 | 1 | 00020000 |
| 0004 | 2 | 00021000 |
| 0008 | 3 | 00032000 |
| 0010 | 1 | 00012000 |
| 0013 | 2 | 02012000 |
| ... | ... | ... |

FIG. 6

| replication data node table 70 | |
|---|---|
| object id 71 | destination node id 72 |
| 0202 | 1 |
| 0303 | 2 |
| 1233 | 3 |
| 3022 | 1 |
| 4002 | 2 |
| ... | ... |

FIG. 7

METHOD AND APPARATUS FOR MANAGING DATA RECOVERY OF DISTRIBUTED STORAGE SYSTEM

BACKGROUND OF THE INVENTION

The present invention relates generally to storage systems and, more particularly, to distributed storage system and method for managing data recovery.

In a distributed storage system, methods for replicating data to other nodes and failure recovery of a storage node are known. The distributed storage system performs to mirror twice or triple replication data to recover composited disks, nodes and/or network failures.

When many nodes fail, the distributed storage system changes the layout of replication data which are stored to the failure nodes to healthy nodes and it copies data to healthy nodes to keep redundancy. However, if too many nodes have failed, physical capacity is insufficient and replication or host write will fail.

BRIEF SUMMARY OF THE INVENTION

Exemplary embodiments of the invention provide a way to manage data recovery in a distributed system when many nodes fail. The distributed storage system has multiple data store nodes. The distributed storage system monitors the total physical capacity of healthy nodes and continues to operate normally when the total physical capacity of healthy nodes is larger than a threshold capacity which is required for twice or triple mirroring capacity of stored data. When enough nodes fail and the total physical capacity of healthy nodes is lower than the threshold capacity, the distributed storage system temporarily changes the redundancy method. In a first approach, data store nodes create parity from two mirroring data sets which are stored newly. If the total physical capacity of healthy nodes continues to drop, in a second approach, data store nodes read an existing mirroring data and creates parity from the existing mirroring data and a mirroring data which is stored newly. The distributed objects storage system manages data redundancy level temporarily to prevent data loss and to prevent reaching full physical capacity.

In accordance with an aspect of the present invention, a storage system comprises: a first node including a first processor; and a plurality of second nodes coupled to the first node, each of the plurality of second nodes including a second processor and one or more second storage devices. The first processor is configured to control to store data and replication of the data in the second storage devices of two or more second nodes. If at least one of the second nodes has failed and a storage capacity of the plurality of second nodes is below a given threshold, one of the second nodes is configured to receive a first data, which is replication of data stored in a failed second node, from another of the second nodes, and create parity data based on the received first data.

In some embodiments, the first node is configured to determine, based on the storage capacity, a coding mode for the second nodes. If the storage capacity is below a first threshold and above a second threshold which is lower than the first threshold, the coding mode is a first coding mode of parity between re-replicated data from multiple second nodes. If the storage capacity is below the second threshold and above a third threshold which is lower than the second threshold, the coding mode is a second coding mode of parity with existing replication data. If the storage capacity is below the third threshold, the coding mode is a higher parity mode having a higher parity than the first coding mode and the second coding mode. If the storage capacity is at or above a fourth threshold equal to or higher than the first threshold, the coding mode is a normal coding mode under which the second node which has created parity data is configured to restore data, which were used to create the parity data, to the other second nodes.

In specific embodiments, the first node is configured to issue a first write request to a first target second node to store primary data and, if the first target second node cannot store the primary data or the first target second node has failed, issue the first write request to another first target second node to store the primary data. The first node is configured to issue a second write request to a second target second node to store mirror data corresponding to the primary data and, if the second target second node cannot store the mirror data or the second target second node has failed, issue the second write request to another second target second node to store the mirror data.

In some embodiments, the first node is configured to determine, based on the storage capacity, a coding mode for the second nodes. If the storage capacity is below a first threshold and above a second threshold which is lower than the first threshold, the coding mode is a first coding mode of parity between re-replicated data from multiple second nodes. If the coding mode is the first coding mode, the second node which has received the first data is configured to receive a second data, which is replication of data stored in a failed second node, and to create parity data based on the received first data and second data.

In specific embodiments, the first node is configured to determine, based on the storage capacity, a coding mode for the second nodes. If the storage capacity is below a first threshold and above a second threshold which is lower than the first threshold, the coding mode is a first coding mode of parity between re-replicated data from multiple second nodes. If the storage capacity is below the second threshold, the coding mode is a second coding mode of parity with existing replication data. If the coding mode is the second coding mode, the second node which receives the first data includes an existing third data which is replication of data stored in another second node, and is configured to create parity data based on the received first data and the existing third data, to overwrite the created parity data to the existing third data, and to delete the received first data.

In some embodiments, the first node is configured to issue a first write request to a first target second node to store primary data. The first target second node is configured to replicate the primary data to the second node which stores the received first data. The second node which stores the received first data is configured to create parity data between the received first data and the replicated primary data.

In specific embodiments, the first node is configured to issue a first read request to a first target second node which stores non-parity data of the read request. If the first target second node cannot access the non-parity data or the first target second node has failed, the first node is configured to search a second target second node which stores parity data created using the non-parity data, and the second target second node is configured to issue a second read request to a destination second node which has parity restore data for the parity data, to receive the parity restore data from the destination second node, and to restore recovery data between the received parity restore data from the destination second node and the parity data.

Another aspect of the invention is directed to a method for managing data storage in a storage system which includes a first node having a first processor and a plurality of second nodes coupled to the first node, each of the plurality of second nodes having a second processor and one or more second storage devices. The method comprises: controlling to store data and replication of the data in the second storage devices of two or more second nodes; and if at least one of the second nodes has failed and a storage capacity of the plurality of second nodes is below a given threshold, receiving by one of the second nodes a first data, which is replication of data stored in a failed second node, from another of the second nodes, and creating parity data based on the received first data.

Another aspect of the invention is directed to a computer-readable storage medium storing a plurality of instructions for managing data storage in a storage system which includes a first node having a first processor and a plurality of second nodes coupled to the first node, each of the plurality of second nodes having a second processor and one or more second storage devices. The plurality of instructions comprise: instructions that cause the first processor to control to store data and replication of the data in the second storage devices of two or more second nodes; and instructions that, if at least one of the second nodes has failed and a storage capacity of the plurality of second nodes is below a given threshold, cause the second processor of one of the second nodes to receive a first data, which is replication of data stored in a failed second node, from another of the second nodes, and create parity data based on the received first data.

These and other features and advantages of the present invention will become apparent to those of ordinary skill in the art in view of the following detailed description of the specific embodiments.

BRIEF DESCRIPTION OF THE DRAWINGS

FIG. 4 shows an example of a data store nodes table.

FIG. 5 shows an example of a replication data layout table.

FIG. 6 shows an example of a data layout table.

FIG. 7 shows an example of a replication data node table.

DETAILED DESCRIPTION OF THE INVENTION

Figure 1:
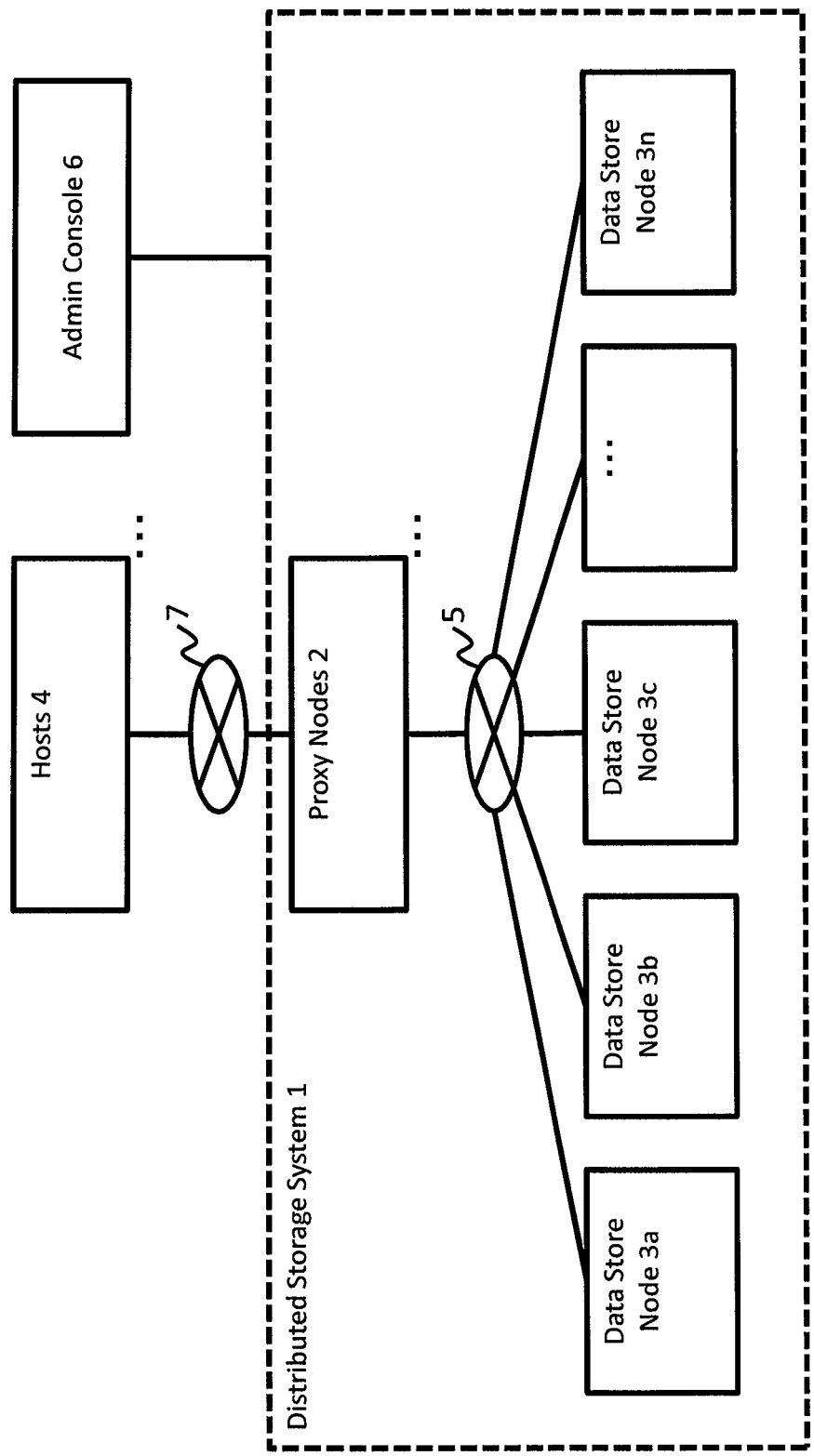
FIG. 1 illustrates an example of a hardware configuration of a computer system in which the method and apparatus of the invention may be applied.

In the following detailed description of the invention, reference is made to the accompanying drawings which form a part of the disclosure, and in which are shown by way of illustration, and not of limitation, exemplary embodiments by which the invention may be practiced. In the drawings, like numerals describe substantially similar components throughout the several views. Further, it should be noted that while the detailed description provides various exemplary embodiments, as described below and as illustrated in the drawings, the present invention is not limited to the embodiments described and illustrated herein, but can extend to other embodiments, as would be known or as would become known to those skilled in the art. Reference in the specification to "one embodiment," "this embodiment," or "these embodiments" means that a particular feature, structure, or characteristic described in connection with the embodiment is included in at least one embodiment of the invention, and the appearances of these phrases in various places in the specification are not necessarily all referring to the same embodiment. Additionally, in the following detailed description, numerous specific details are set forth in order to provide a thorough understanding of the present invention. However, it will be apparent to one of ordinary skill in the art that these specific details may not all be needed to practice the present invention. In other circumstances, well-known structures, materials, circuits, processes and interfaces have not been described in detail, and/or may be illustrated in block diagram form, so as to not unnecessarily obscure the present invention.

Furthermore, some portions of the detailed description that follow are presented in terms of algorithms and symbolic representations of operations within a computer. These algorithmic descriptions and symbolic representations are the means used by those skilled in the data processing arts to most effectively convey the essence of their innovations to others skilled in the art. An algorithm is a series of defined steps leading to a desired end state or result. In the present invention, the steps carried out require physical manipulations of tangible quantities for achieving a tangible result. Usually, though not necessarily, these quantities take the form of electrical or magnetic signals or instructions capable of being stored, transferred, combined, compared, and otherwise manipulated. It has proven convenient at times, principally for reasons of common usage, to refer to these signals as bits, values, elements, symbols, characters, terms, numbers, instructions, or the like. It should be borne in mind, however, that all of these and similar terms are to be associated with the appropriate physical quantities and are merely convenient labels applied to these quantities. Unless specifically stated otherwise, as apparent from the following discussion, it is appreciated that throughout the description, discussions utilizing terms such as "processing," "computing," "calculating," "determining," "displaying," or the like, can include the actions and processes of a computer system or other information processing device that manipulates and transforms data represented as physical (electronic) quantities within the computer system's registers and memories into other data similarly represented as physical quantities within the computer system's memories or registers or other information storage, transmission or display devices.

The present invention also relates to an apparatus for performing the operations herein. This apparatus may be specially constructed for the required purposes, or it may include one or more general-purpose computers selectively activated or reconfigured by one or more computer programs. Such computer programs may be stored in a computer-readable storage medium including non-transitory medium, such as, but not limited to optical disks, magnetic disks, read-only memories, random access memories, solid state devices and drives, or any other types of media suitable for storing electronic information. The algorithms and displays presented herein are not inherently related to any particular computer or other apparatus. Various general-purpose systems may be used with programs and modules in accordance with the teachings herein, or it may prove convenient to construct a more specialized apparatus to perform desired method steps. In addition, the present invention is not described with reference to any particular programming language. It will be appreciated that a variety of programming languages may be used to implement the teachings of the invention as described herein. The instructions of the programming language(s) may be executed by one or more processing devices, e.g., central processing units (CPUs), processors, or controllers.

Exemplary embodiments of the invention, as will be described in greater detail below, provide apparatuses, methods and computer programs for managing data recovery in a distributed storage system.

FIG. 1 illustrates an example of a hardware configuration of a computer system in which the method and apparatus of the invention may be applied. The distributed storage system 1 contains a plurality of proxy nodes 2, a plurality of data store nodes 3, and a distributed storage network 5. A host 4 is connected to the distributed storage system 1 via the proxy nodes 2 using the network 7. The distributed storage system 1 is connected to an administrator console 6 via a management network.

Figure 2B:
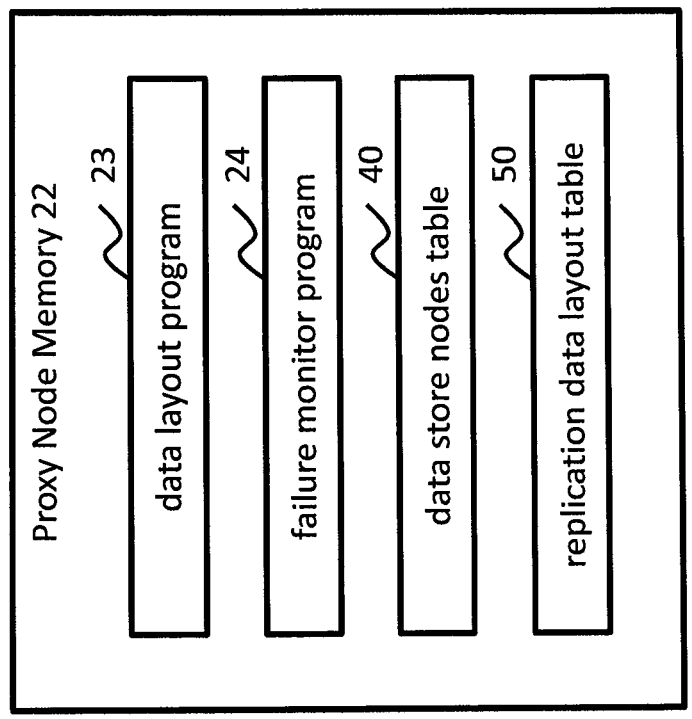
FIG. 2b shows an example of the proxy node memory.
Figure 2A:
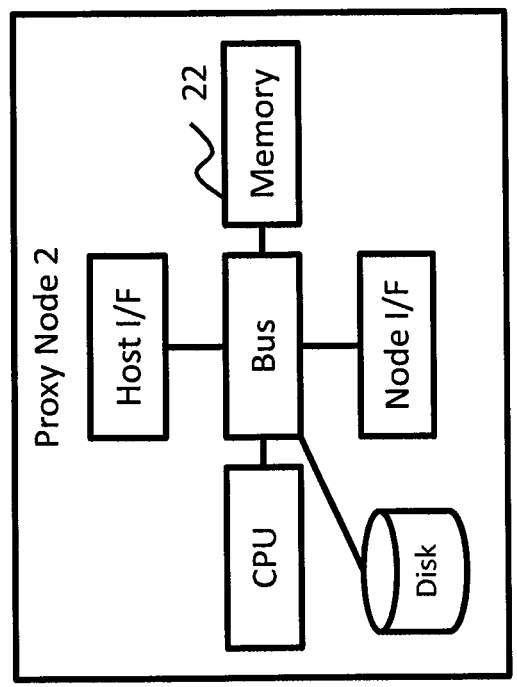
FIG. 2a shows an example of a proxy node.

FIG. 2a shows an example of a proxy node 2. The proxy node 2 contains a host I/F which connect to the host, a CPU, a memory 22, a node I/F, and a Disk I/F, which are connected with each other by a bus I/F such as PCI, DDR, SCSI. FIG. 2b shows an example of the proxy node memory 22. The proxy node memory 22 contains a data layout program 23, a failure monitor program 24, a data store nodes table 40 (FIG. 4), and a replication data layout table 50 (FIG. 5).

Figure 3B:
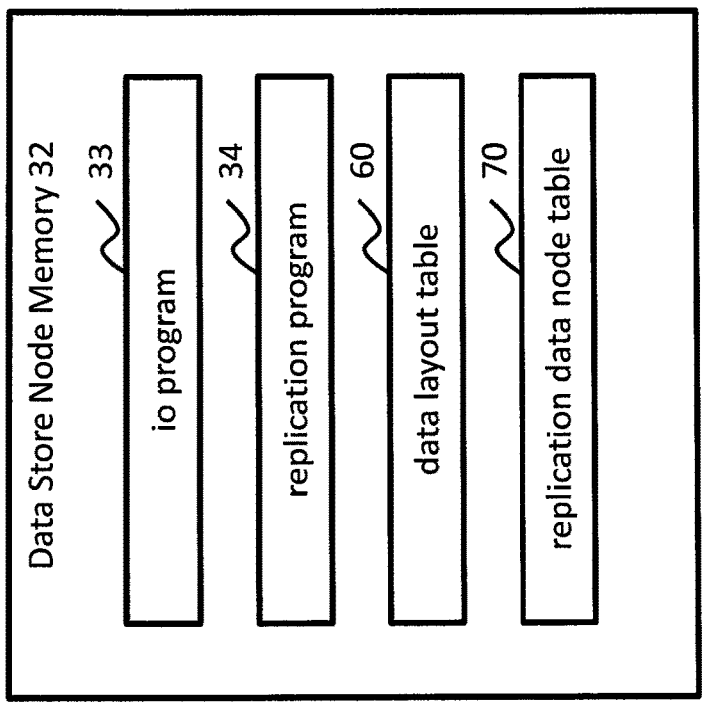
FIG. 3b shows an example of the data store node memory.
Figure 3A:
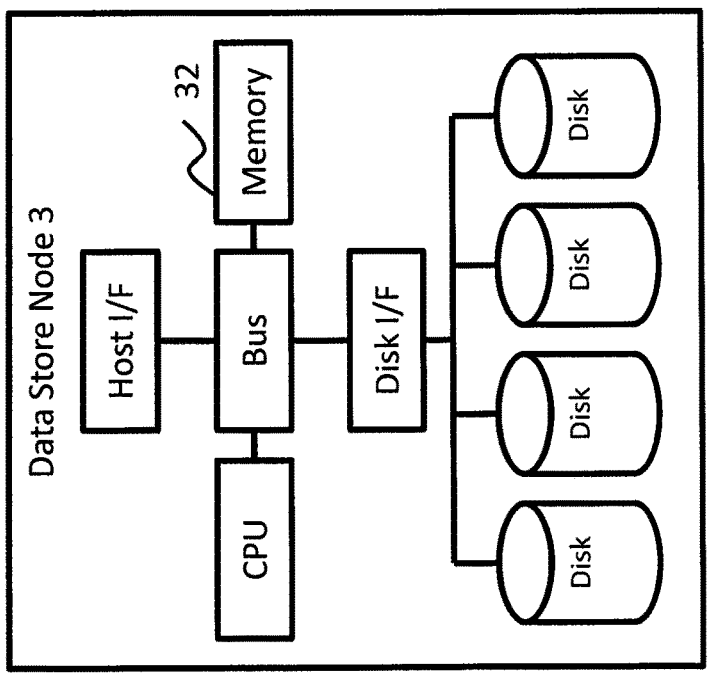
FIG. 3a shows example of a data store node.

FIG. 3a shows example of a data store node 3. The data store node 3 contains a host I/F which connect to the host via a proxy node 2, a CPU, a memory 33, a Disk I/F, and HDDs, which are connected with each other by a bus I/F such as PCI, DDR, SCSI. FIG. 3b shows an example of the data store node memory 32. The data store node memory 32 contains an IO (Input/Output) program 33, a replication program 34, a data layout table 60 (FIG. 6), and a replication data node table 70 (FIG. 7). The data layout table 60 and/or replication data node table 70 can be stored to disks in the data store node 3.

FIG. 4 shows an example of a data store nodes table 40. The data store nodes table 40 contains columns of node ID 41, node condition flag 42, physical data capacity 43, stored data capacity 44, and failure capacity 45. The node ID 41 is a unique data store node identifier. The physical data capacity 43 is the total usable physical capacity in the data store node. The stored data capacity 44 is the used physical capacity in the data store node which is used for storing data. The failure capacity 45 is the total failure capacity which is related to disk failure, network cable failure, or the node failure in the data store node. The total capacity is equal to the sum of the stored data capacity 44 and the failure capacity 45. The remaining usable capacity is equal to the physical data capacity 43 minus the stored data capacity 44. The monitor program 24 in the proxy node monitors the condition status and these capacities. Based on the healthy nodes, the data layout program 23 calculates the object location using consistency hash function. Also, the mirror data location is calculated using the consistency hash function.

FIG. 5 shows an example of a replication data layout table 50. The replication data layout table 50 contains columns of object ID 51, destination node ID 52, coding mode flag 53, and replication mode flag 54. The object ID 51 is a unique object data ID. The destination node ID 52 is a node ID where the replication data is temporarily stored. The coding mode flag 53 contains the coding mode which is changed from the original replication mode such as mirroring or triplication to the coding mode such as parity 2, parity 3, parity 4, and so on. The replication mode flag 54 contains the coding target data which may be data, mirror 1 (i.e., primary copy data for duplication), mirror 2 (i.e., secondary copy data for triplication), etc. If the field contains data, first data is generated parity by other data, so that mirror data can access directory and original data are restored by parity and other data. If the field contains mirror 1, then mirror data related object ID is generated parity by other data. The replication data layout table 50 contains replication data only when the coding mode is changed due to a lack of physical capacity in the distributed storage system.

FIG. 6 shows an example of a data layout table 60. The data layout table 60 contains columns of object ID 61, HDD ID 62, and location address 63. The object ID 61 is a unique object data ID. The object data contains replication mirror data or parity data which is generated from other nodes. The HDD ID 62 and location address 63 contains the location in which the object data is stored.

FIG. 7 shows an example of a replication data node table 70. The replication data node table 70 contains columns of object ID 71 and destination node ID 72. The object ID 61 is a unique object data ID identifying the object data for which the coding mode is changed. The destination node ID 72 contains the node ID identifying the node in which the replication data is stored.

Figure 8:
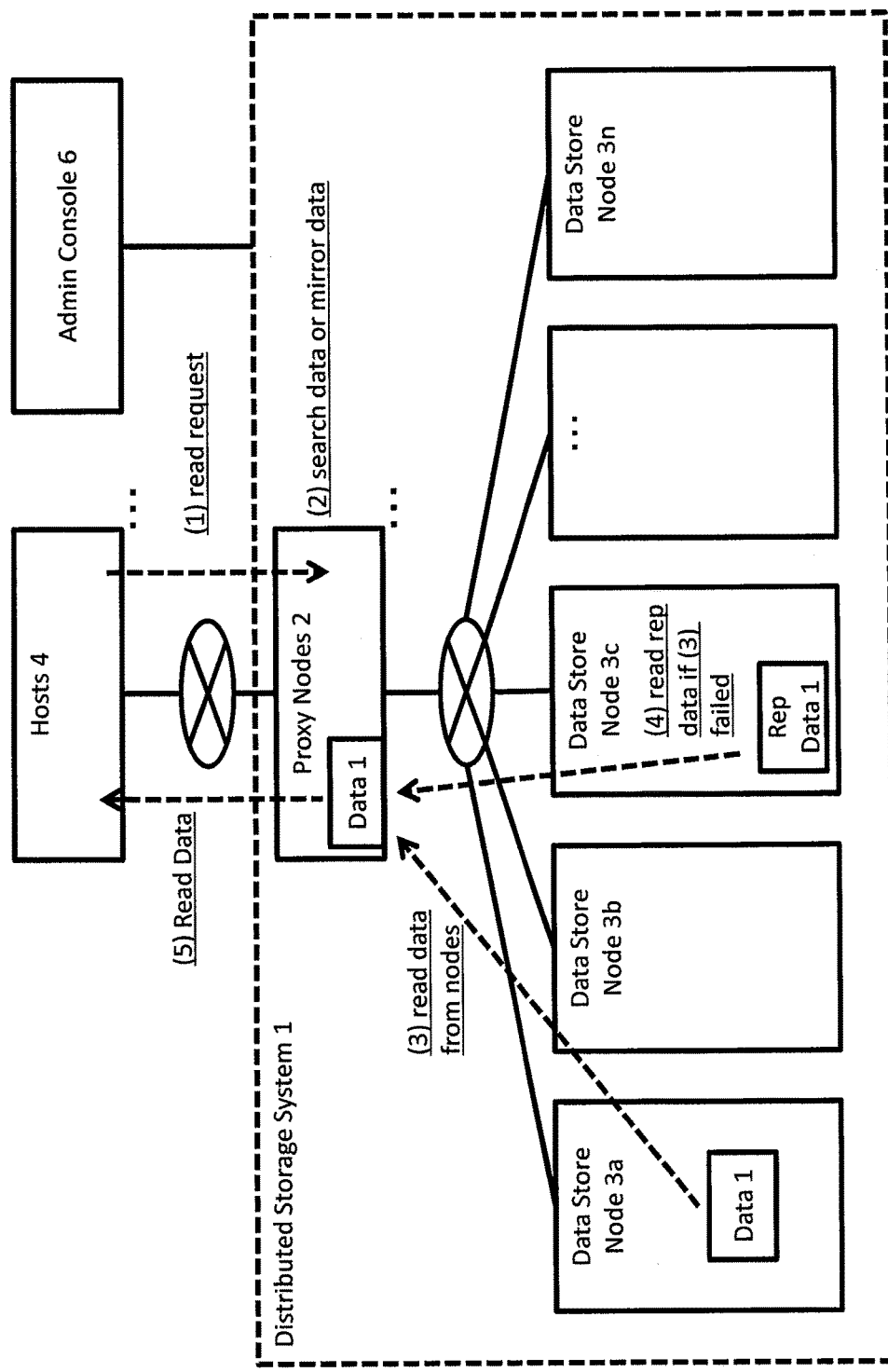
FIG. 8 is an overview of a normal read operation.

FIG. 8 is an overview of a normal read operation. In step (1), a host issues a read request to the proxy nodes. In step (2), a proxy node calculates the hash value and searches the data store node in which is stored the primary data or mirror data. This example is based on mirroring; triplication involves the same process flow but with steps (3)-(5) performed repeatedly. In step (3), the proxy node issues a read request to the data store node which has the primary data. If the data store node can access the primary data, the next step is step (5). If the data store node cannot access the primary data or the data store node has failed, the next step is step (4). In step (4), the proxy node issues a read request to the data store node which has the mirror data. If the data store node can access the mirror data, the read request is processed and the next step is step (5). If the proxy node cannot access the mirror data or the data store node has failed, the read request has failed. In step (5), the proxy node returns read data to the host.

Figure 9:
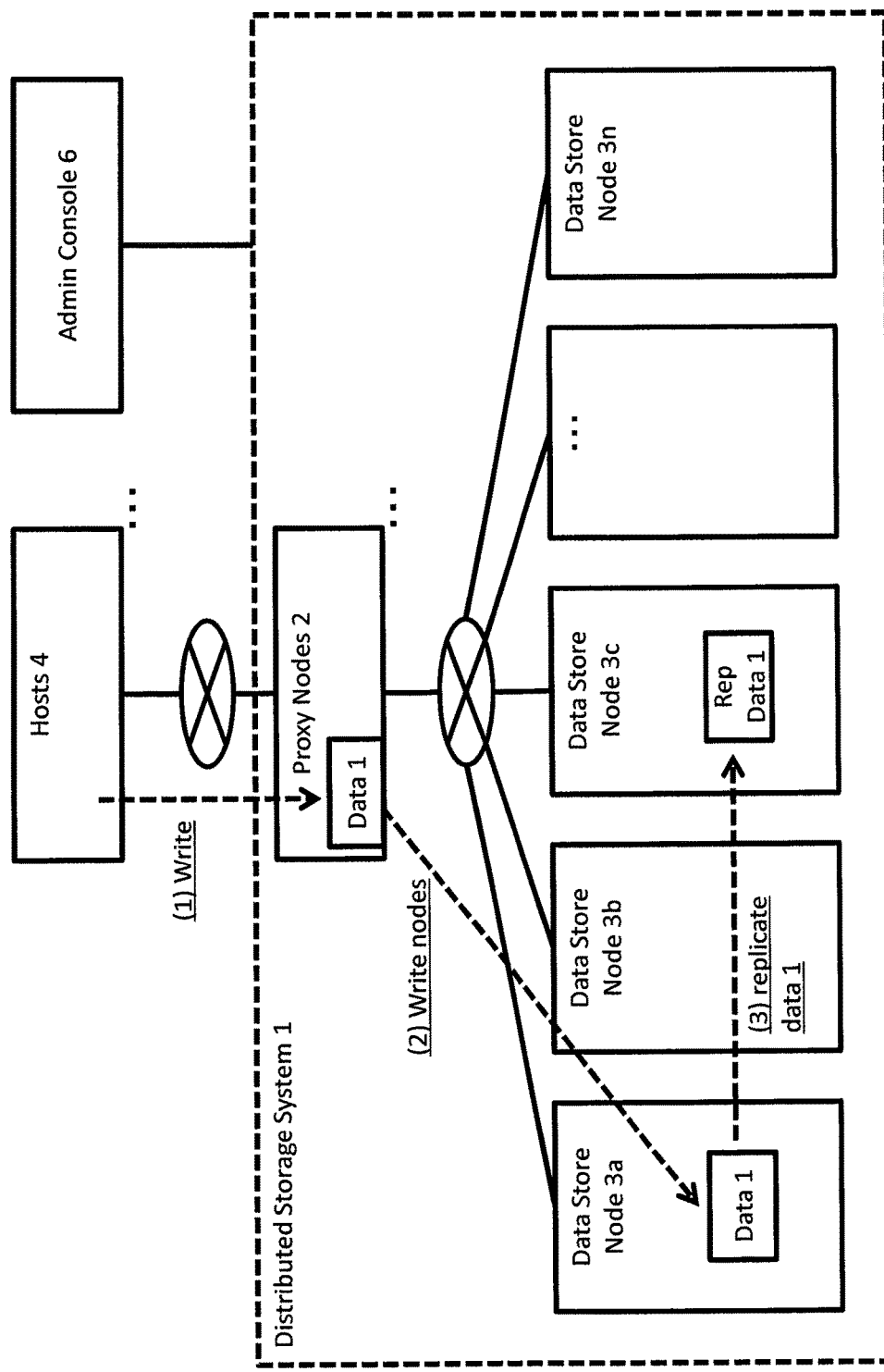
FIG. 9 is an overview of a normal write operation.

FIG. 9 is an overview of a normal write operation. In step (1), a host issues a write request to the proxy nodes. In step (2), a proxy node calculates the hash value and searches the data store node which is to store the primary data. The example is based on mirroring; triplication involves the same process flow but with step (3) performed repeatedly. The proxy node issues a write request to the data store node which is to store the primary data. If the data store node can store the primary data, the next step is step (3). If the data store node cannot store the primary data or the data store node has failed, then the proxy node recalculates the hash value to remove the failed data store node and retry step (2). In step (3), the data store node calculates the hash value for a replication data location. Then the data store node issues a write request to the data store node which is to store the mirror data. If the data store node cannot store the mirror data or the data store node has failed, then the proxy node recalculates the hash value to remove the failed data store node and retry step (3). If the data store node can store the mirror data, then the data store node which can store the mirror data returns a good response to the data store node which can store the primary data and the proxy node.

Figure 10:
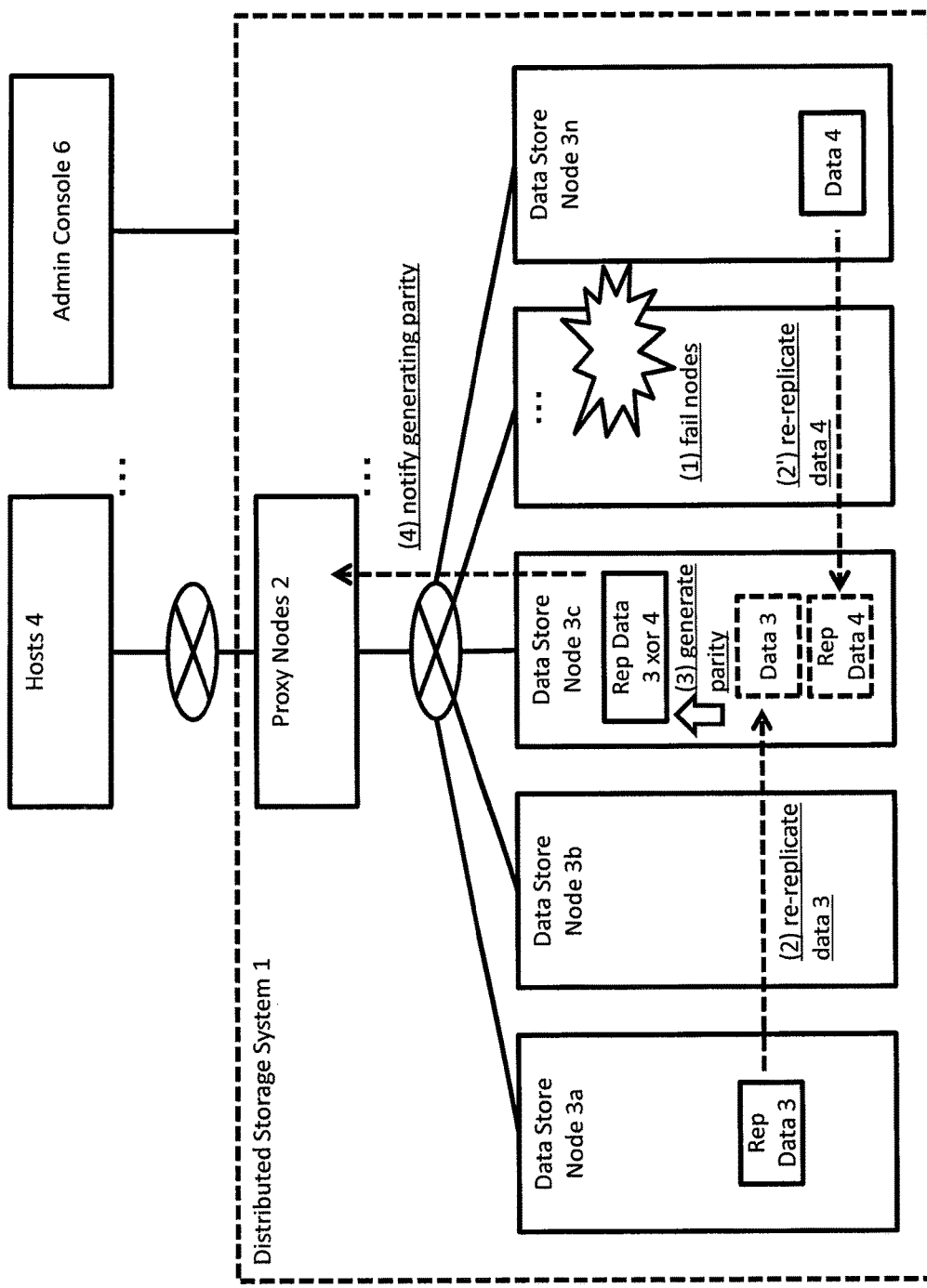
FIG. 10 is an overview of the process of changing replication mode and generating parity between re-replicated data.

FIG. 10 is an overview of the process of changing replication mode and generating parity between re-replicated data. In step (1), some data store nodes have failed and the failure monitor program in the proxy nodes updates the data store nodes table 40. In this case, the physical capacity is lower than a threshold which can support storing mirror data to re-replicate data. As a result, the proxy nodes change the coding mode and broadcast the change to all data store nodes in the distributed storage system. In steps (2) and (2'), a data store node checks all mirror data. If the mirror data is stored to failure nodes or failure disk, then the data store node (source) calculates the consistency hash value and determines a specific data store node (destination) and the source data store node re-replicates data to the specific destination data store node which was determined by hash calculation. Then the source data store node updates the replication data node table 70. In FIG. 10, step (2) shows re-replicating Rep Data 3 from data store node 3a (first source) to data store node 3c (destination) as Data 3 and step (2') shows re-replicating Data 4 from data store node 3n (second source) to data store node 3c (destination) as Rep Data 4. In step (3), if the destination data store node receives some re-replicated data from other data store nodes, then the destination data store node generates parity between the re-replicated data in those other data store nodes. In step (4), the destination data store node notifies the proxy nodes 2 of generating parity between the re-replicated data. Then the proxy nodes 2 update the replicated data layout table 50.

Figure 11:
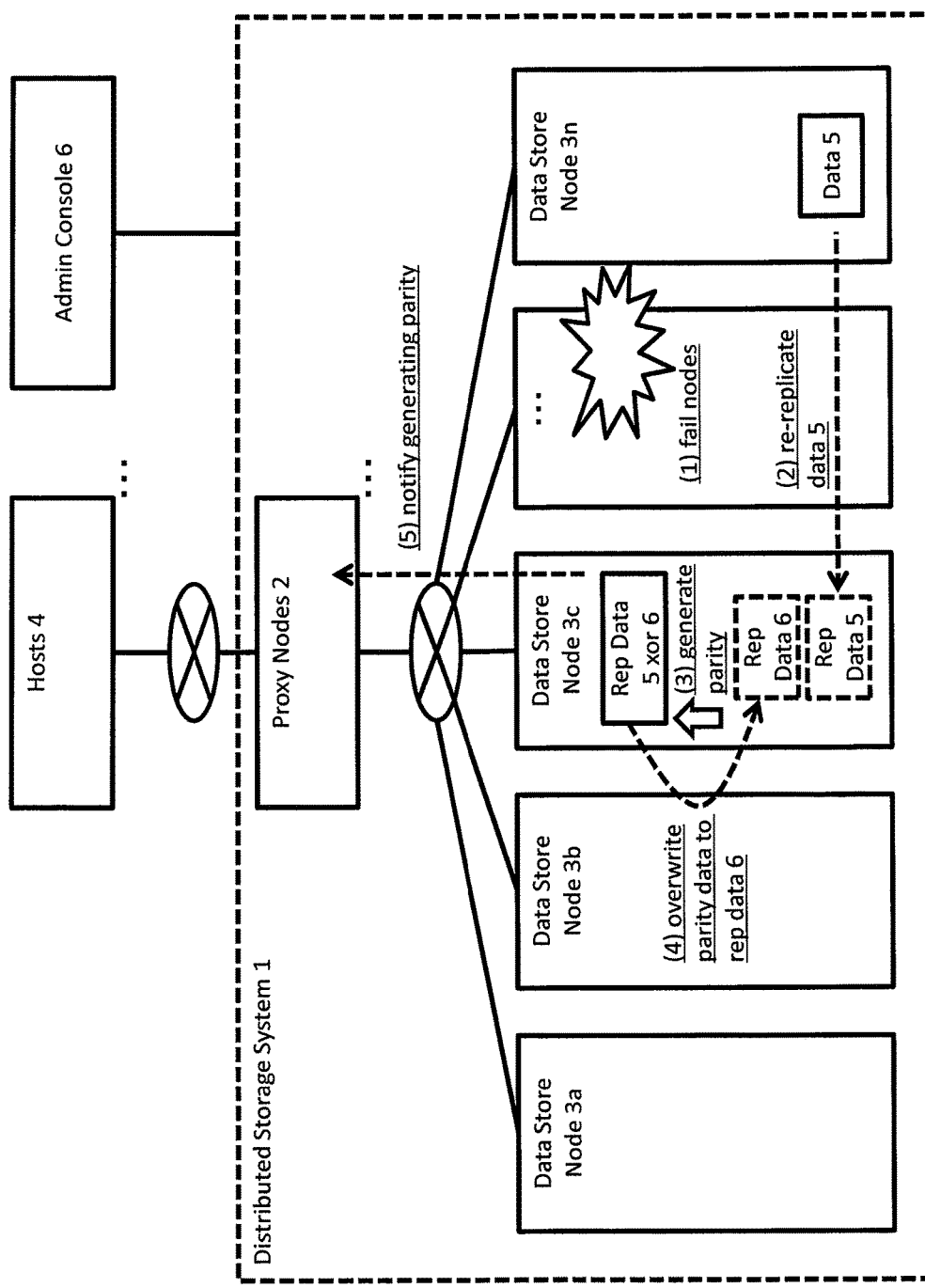
FIG. 11 is overview of the process of changing replication mode and generating parity between re-replicated data and existing replication data.

FIG. 11 is overview of the process of changing replication mode and generating parity between re-replicated data and existing replication data. In step (1), some data store nodes have failed and the failure monitor program in the proxy nodes updates the data store nodes table 40. In this case, the physical capacity is lower than another threshold (even lower threshold than that in FIG. 10) which can support storing parity generation for re-replicate data in FIG. 10. As a result, the proxy nodes change the coding mode and increase the target of generating parity for existing replicated data, and the proxy nodes broadcast the changing mode to all data store nodes in the distributed storage system. In step (2), a data store node checks all mirror data. If the mirror data is stored to failure nodes or failure disk, then the data store node (source) calculates the consistency hash value and determines a specific data store node (destination) and the source data store node 3n re-replicates data to the specific destination data store node 3c which was determined by hash calculation. Then the source data store nodes updates the replication data node table 70. In step (3), if the destination data store node receives the re-replicated data and the destination data store node has existing replication data, then the destination data store node generates parity between the re-replicated data and existing replication data. In step (4), the destination data store node overwrites parity to the existing replication data. Then the destination data store node deletes the received re-replicated data from the source data storage node. In step (5), the destination data store node notifies the proxy nodes 2 of generating parity. The proxy nodes 2 update the replicated data layout table 50.

Figure 12:
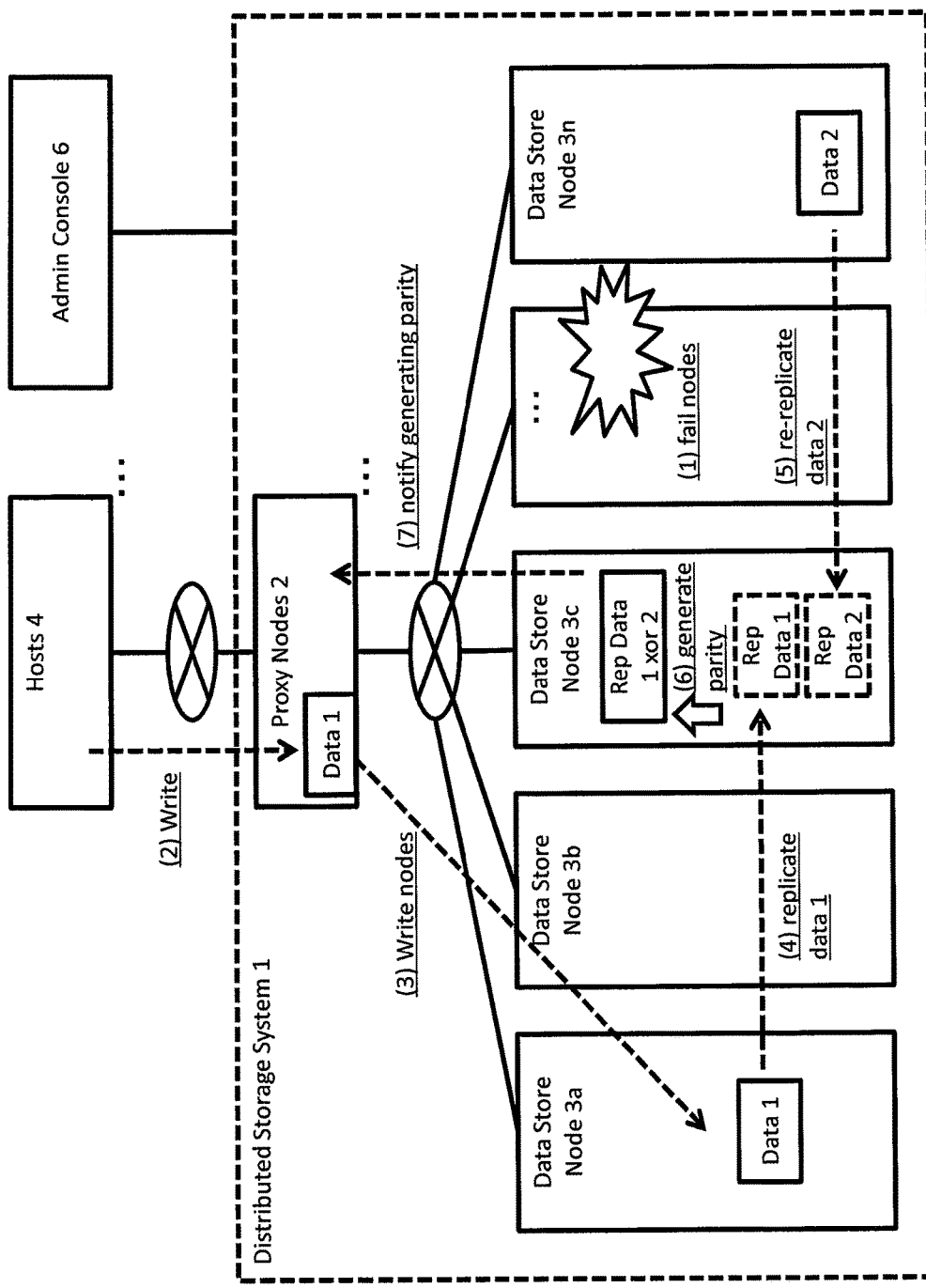
FIG. 12 is an overview of the process of changing replication mode and generating parity between re-replicated data involving a write operation.

FIG. 12 is an overview of the process of changing replication mode and generating parity between re-replicated data involving a write operation. The process flow is similar to the write flow in FIG. 9 and the generating parity flow in FIG. 10. Step (1) in FIG. 12 is similar to step (1) in FIG. 10. Step (2) in FIG. 12 is similar to step (1) in FIG. 9. Step (3) in FIG. 12 is similar to step (2) in FIG. 9. Step (4) in FIG. 12 is similar to step (3) in FIG. 9. Step (5) in FIG. 12 is similar to step (2') in FIG. 10. Step (6) in FIG. 12 is similar to step (3) in FIG. 10. Step (7) in FIG. 12 is similar to step (4) in FIG. 10.

Figure 13:
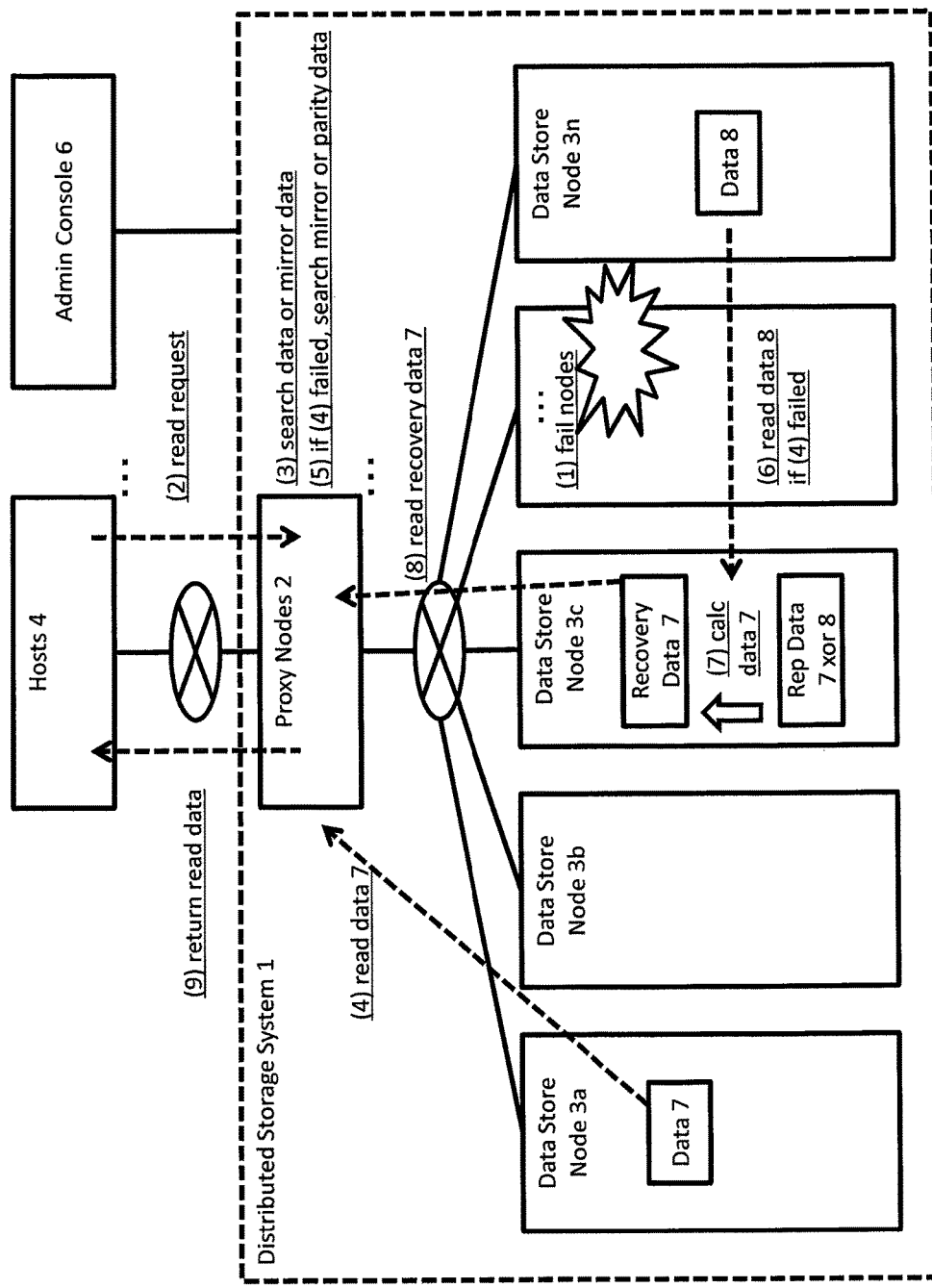
FIG. 13 is an overview of a read operation during a change in the coding mode.

FIG. 13 is an overview of a read operation during a change in the coding mode. In step (1), some data store nodes have failed and the failure monitor program in the proxy nodes updates the data store nodes table 40. In this case, the physical capacity is lower than a threshold which can support storing mirror data to re-replicate data. As a result, the proxy nodes change the coding mode and broadcast the change to all data store nodes in the distributed storage system. In step (2), a host issues a read request to the proxy nodes. In step (3), a proxy node calculates the hash value and searches the data store node in which is stored the primary data or mirror data. If the proxy node searches replication data layout table 50 and the primary data is generated parity, the proxy node calculates the hash value for replication data since at least one data or replication data is not generated parity. In step (4), the proxy node issues a read request to the data store node 3a which stores the data (Data 7). If the data store node can access the data, the next step is step (9). If the data store node cannot access the data or the data store node has failed, the next step is step (5).

In step (5), the proxy node calculates the hash value and searches the data store node in which is stored the parity data. The proxy node issues a read request to the data store node which stores the parity data. In step (6), the data store node which stores the parity data (source) searches the replication data node table 70, and then the source data store node 3c issues a read request to the destination data store node 3n which contains the parity restore data (Data 8). In step (7), the source data store node which stores the parity data restores recovery data (Recovery Data 7) between the received parity restore data from the destination data store node and the parity data (Rep Data 7 xor 8). In step (8), the source data store node returns the recovery data. In step (9), the proxy node returns the read data to the host.

Figure 14:
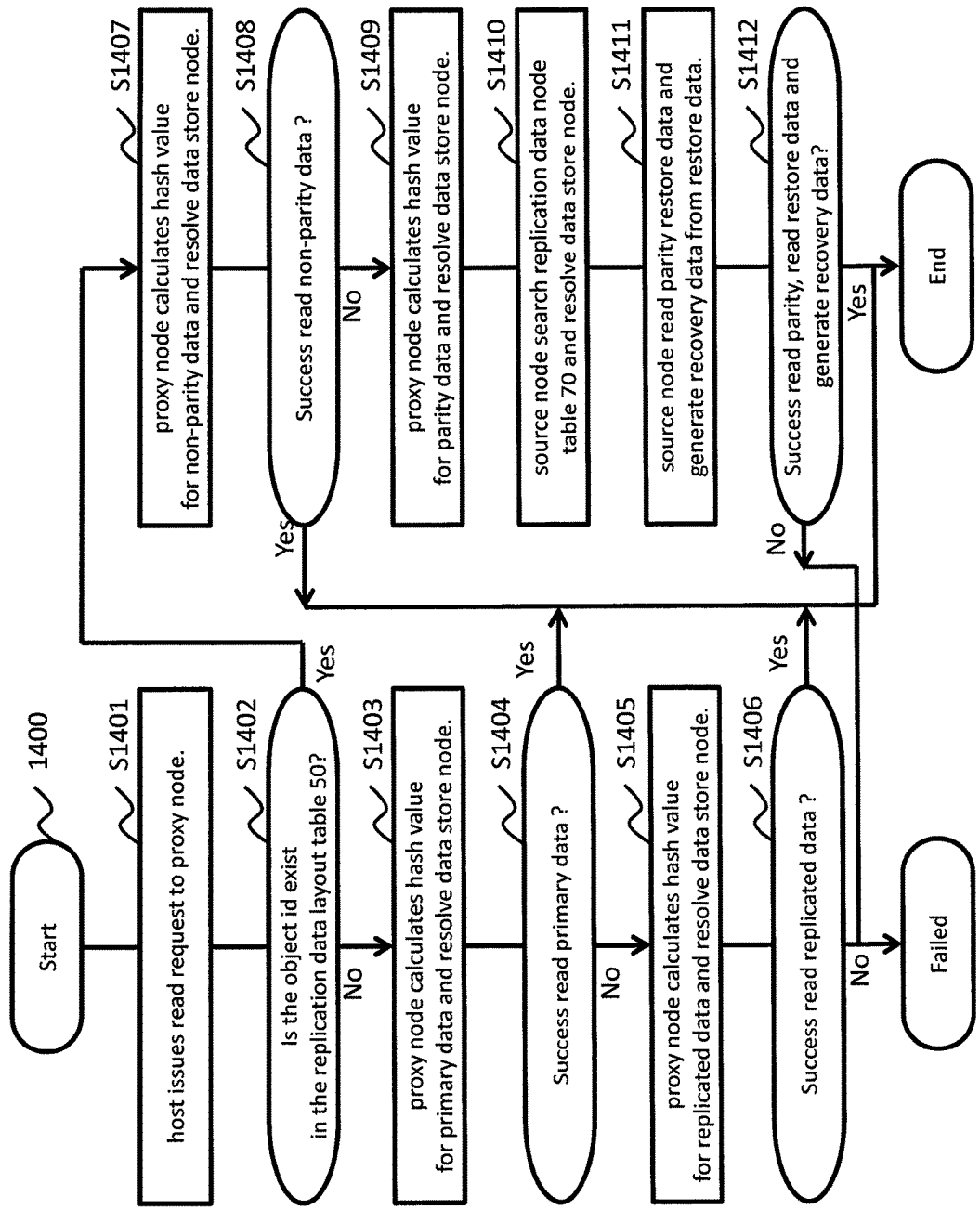
FIG. 14 shows an example of a flow diagram illustrating a read operation and parity recovery read.

FIG. 14 shows an example of a flow diagram 1400 illustrating a read operation and parity recovery read. In step S1401, a host issues a read request to the proxy nodes. In step S1402, the proxy node searches the replication data layout table 50. If the object ID associated with the read request exists in the table (YES), the next step is S1407. If No, the next step is S1403. The following is related to the normal read operation in FIG. 8. In step S1403, a proxy node calculates the hash value and searches the data store node in which is stored the primary data or mirror data. In step S1404, the proxy node issues a read request to the data store node which stores the data. If the data store node can access the data (YES), then the proxy node returns the read data to the host and the process ends. If the data store node cannot access the data or the data store node has failed (No), the next step is S1405. In step S1405, the proxy node calculates the hash value and searches the data store nodes in which is stored the replicated data. The proxy node issues a read request to the data store node which stores the replicated data. In step S1406, if the data store node can access the replicated data (YES), then the proxy node returns the read data to the host as recovery of failed data in S1404 and the process ends. If the data store node cannot access the replicated data or the data store node has failed (No), the host read operation has failed and the process ends.

The following is related to the read operation during a change in the coding mode of FIG. 13. In step S1407, the proxy node calculates the hash value and searches the data store node in which is stored non-parity data. The proxy node issues a read request to the data store node which stores the non-parity data. In step S1408, if the data store node can access the non-parity data (YES), then the proxy node returns the read data and the process ends. If the data store node cannot access the non-parity data or the data store node has failed (No), the next step is S1409. In step S1409, the proxy node calculates the hash value and searches the data store node in which is stored parity data. The proxy node issues a read request to the data store node which stores the parity data. In step S1410, the data store node which stores the parity data (source) searches the replication data node table 70, and then the source data store node issues a read request to the destination data store node which contains parity restore data. In step S1411, the source data store node which stores the parity data restores recovery data between the received parity restore data from the destination data store node and the parity data. In step S1412, if the source data store node reads parity and reads restore data and generates recovery data (YES), then the proxy node returns the recovery data to the host as recovery of failed data in S1408 and the process ends. If the data store node cannot access the recovery data or the data store node has failed (No), the host read operation has failed and the process ends.

Figure 15:
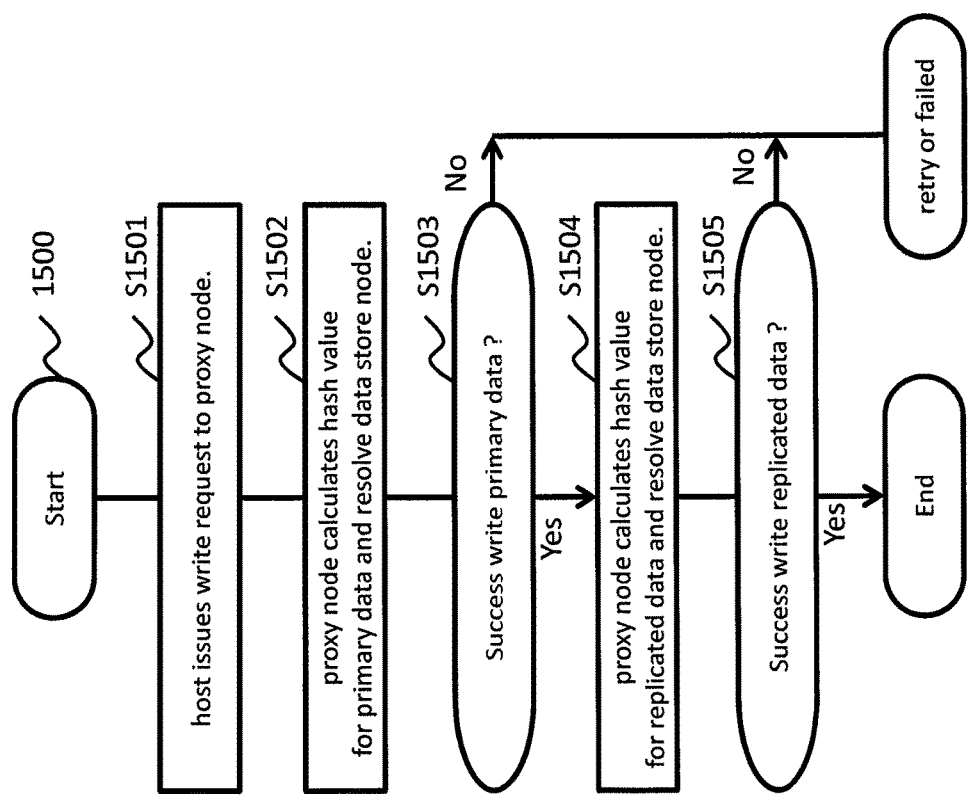
FIG. 15 shows an example of a flow diagram illustrating a process for host write operation.

FIG. 15 shows an example of a flow diagram 1500 illustrating a process for host write operation. This is related to the normal write operation of FIG. 9. In step S1501, a host issues a write request to the proxy nodes. In step S1502, a proxy node calculates the hash value and searches the data store node which is to store the primary data. In step S1503, the proxy node issues a write request to the data store node which is to store the primary data. If the data store node can store primary data, the next step is S1504. If the data store node cannot store the primary data or the data store node has failed, then the proxy node recalculates the hash value to remove the failed data store node and retries step S1502 or fails the host write operation. In step S1504, the data store node calculates the hash value for replication data location. In step S1505, the data store node issues a write request to the data store node which is to store the mirror data. If the data store node which is to store the mirror data cannot store the mirror data or it has failed, then the proxy node recalculates the hash value to remove the failed data store node and retries step S1504. If the data store node can store the mirror data, then it returns a good response to the data store node which is to store the primary data and the proxy node, and the process ends.

Figure 16:
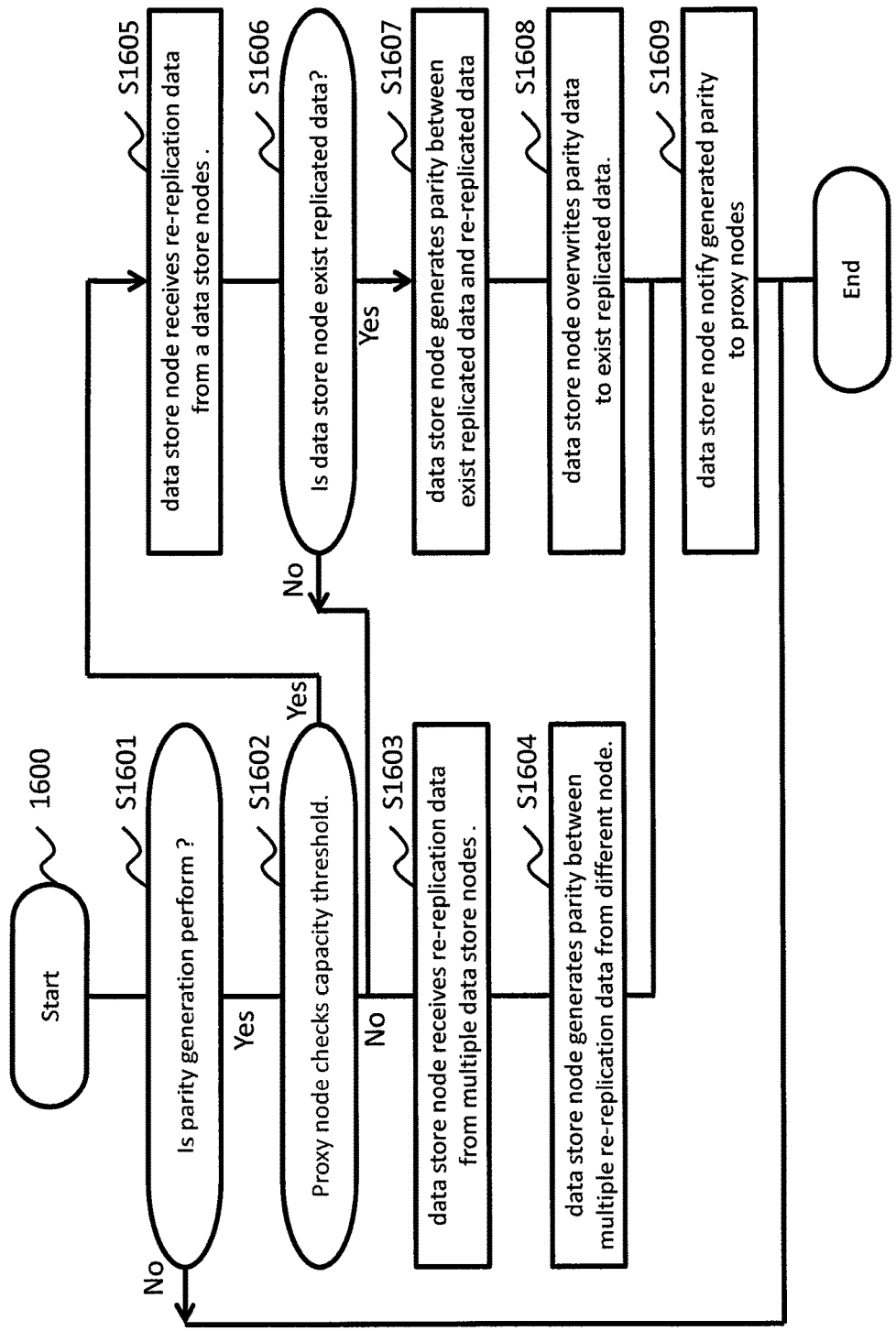
FIG. 16 shows an example of a flow diagram illustrating a process for generating parity between re-replicated data or between re-replicated data and existing replicated data.

FIG. 16 shows an example of a flow diagram 1600 illustrating a process for generating parity between re-replicated data or between re-replicated data and existing replicated data. In step S1601, a data store node checks all mirror data. If the mirror data is stored to failure nodes or failure disk, the data store node calculates the consistency hash value and determines a specific data store node and the data store node (source) re-replicates data to the specific data store node which was determined by hash calculation. Then the source data store node updates the replication data node table 70. If the coding mode is parity (YES), the next step is S1602. If NO, then all data store nodes re-replicate data to other nodes and the process ends. In step S1602, the proxy node checks the capacity threshold to determine the coding mode. If the coding mode is parity with existing replication data mode (YES), the next step is S1605. If NO, the next step is S1603.

The following is related to the process of changing replication mode and generating parity between re-replicated data of FIG. 10. In step S1603, the destination data store node receives some re-replicated data which is for other data store nodes. In step S1604, the destination data store node generates parity between the re-replicated data in other data store nodes. The next step is S1609.

The following is related to the process of changing replication mode and generating parity between re-replicated data and existing replication data of FIG. 11. In step S1605, the destination data store node receives re-replicated data from other data store node(s). In step S1606, it is determined whether the destination data store node has existing replication data. If YES, the next step is S1607. If NO, the next step is S1603. In step S1607, the destination data store node generates parity between the re-replicated data and existing replication data. In step S1608, the destination data store node overwrites parity to the existing replication data. Then the destination data store node deletes the received re-replicated data from the source data storage node. In step S1609, the destination data store node notifies the proxy nodes of generating parity. The proxy nodes update the replicated data layout table 50.

Figure 17:
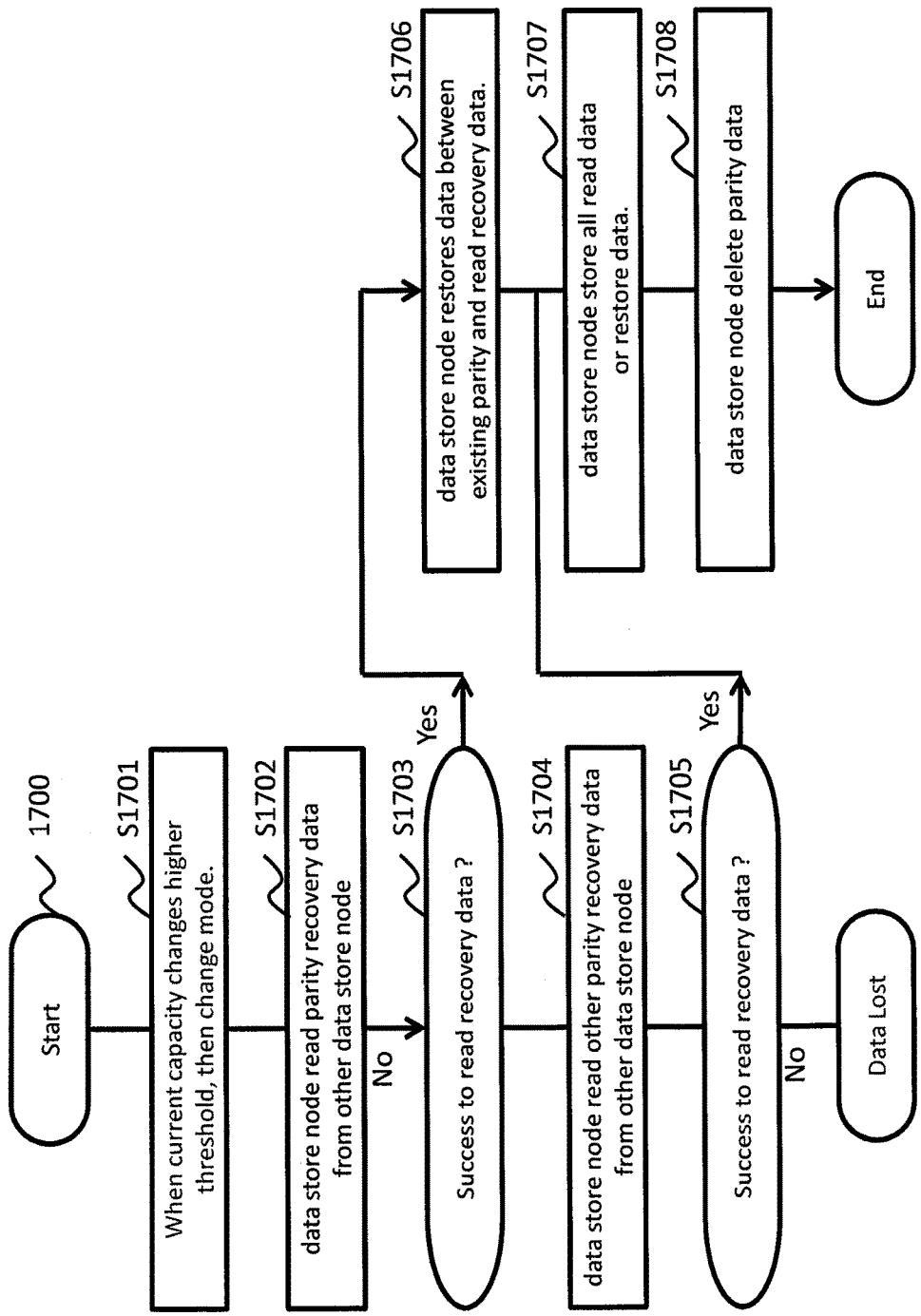
FIG. 17 shows an example of a flow diagram illustrating a process for restoring parity data to normal mode.

FIG. 17 shows an example of a flow diagram 1700 illustrating a process for restoring parity data to normal mode. In step S1701, the failed data store node recovers or is replaced. The physical capacity in the distributed storage system exceeds a first threshold such that the coding mode can be changed to normal, with replication or triplication. In step S1702, all data store nodes read parity recovery data from other data store nodes based on the replication data node table 70. In step S1703, if the data store node succeeds in reading recovery data, the next step is S1706. If the data store node failed to read recovery data, the next step is S1704. The approach is to read other original data. In step S1704, the data store nodes read other parity recovery data from other data store nodes based on the replication data node table 70. In step S1705, if the data store node succeeds in reading other parity recovery data, the next step is S1707. If the data store node fails to read recovery data, the two data are lost and the recovery fails, and the process ends. On the other hand, if the data store node succeeds in reading recovery data in step S1703, a process of parity recovery is performed as follows. In step S1706, the data store node restores data between existing parity and read recovery data. The next step is S1707. If step S1707 follows step S1705, the data store node stores all read data. If step S1707 follows step S1706, the data store node store reads data and parity restore data. If the data store node failed to store data, then the operation has failed and the process ends. In step S1708, the data store node deletes the parity data.

Figure 18:
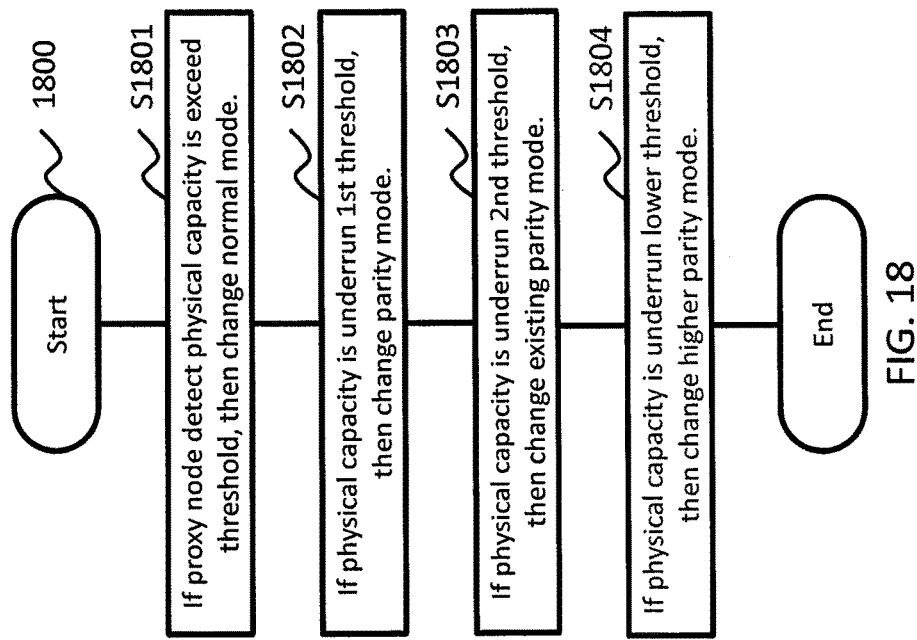
FIG. 18 shows an example of a flow diagram illustrating a process for changing replication mode.

FIG. 18 shows an example of a flow diagram 1800 illustrating a process for changing replication mode. In step S1801, the failed data store node recovers or is replaced. The physical capacity in the distributed storage system is at or above the first threshold such that the coding mode can be changed to normal, with replication or triplication (see FIG. 17). In another embodiment, the change to normal coding mode may require a physical capacity at or above a fourth threshold that is equal to or higher than the first threshold. In step S1802, some data store nodes have failed and the failure monitor program in the proxy nodes update the data store nodes table 40. The physical capacity is lower than the first threshold which can support storing mirror data to re-replicate data. The proxy nodes change the coding mode and broadcast the change to all data store nodes in the distributed storage system (see FIG. 10 or 12). In step S1803, more data store nodes have failed and the failure monitor program in the proxy nodes updates the data store nodes table 40. The physical capacity is lower than the second threshold which can support storing parity generation for re-replicate data. As a result, the proxy nodes change the coding mode and increase the target of generating parity for existing replicated data, and the proxy nodes broadcast the changing mode to all data store nodes in the distributed storage system. In step S1804, more data store nodes have failed and the physical capacity is lower than an even lower threshold (e.g., a third threshold) than the second threshold. As a result, the proxy nodes change the coding mode and increase the target of generating parity to a higher parity.

Of course, the system configuration illustrated in FIG. 1 is purely exemplary of information systems in which the present invention may be implemented, and the invention is not limited to a particular hardware configuration. The computers and storage systems implementing the invention can also have known I/O devices (e.g., CD and DVD drives, floppy disk drives, hard drives, etc.) which can store and read the modules, programs and data structures used to implement the above-described invention. These modules, programs and data structures can be encoded on such computer-readable media. For example, the data structures of the invention can be stored on computer-readable media independently of one or more computer-readable media on which reside the programs used in the invention. The components of the system can be interconnected by any form or medium of digital data communication, e.g., a communication network. Examples of communication networks include local area networks, wide area networks, e.g., the Internet, wireless networks, storage area networks, and the like.

In the description, numerous details are set forth for purposes of explanation in order to provide a thorough understanding of the present invention. However, it will be apparent to one skilled in the art that not all of these specific details are required in order to practice the present invention. It is also noted that the invention may be described as a process, which is usually depicted as a flowchart, a flow diagram, a structure diagram, or a block diagram. Although a flowchart may describe the operations as a sequential process, many of the operations can be performed in parallel or concurrently. In addition, the order of the operations may be re-arranged.

As is known in the art, the operations described above can be performed by hardware, software, or some combination of software and hardware. Various aspects of embodiments of the invention may be implemented using circuits and logic devices (hardware), while other aspects may be implemented using instructions stored on a machine-readable medium (software), which if executed by a processor, would cause the processor to perform a method to carry out embodiments of the invention. Furthermore, some embodiments of the invention may be performed solely in hardware, whereas other embodiments may be performed solely in software. Moreover, the various functions described can be performed in a single unit, or can be spread across a number of components in any number of ways. When performed by software, the methods may be executed by a processor, such as a general purpose computer, based on instructions stored on a computer-readable medium. If desired, the instructions can be stored on the medium in a compressed and/or encrypted format.

From the foregoing, it will be apparent that the invention provides methods, apparatuses and programs stored on computer readable media for managing data recovery in a distributed storage system. Additionally, while specific embodiments have been illustrated and described in this specification, those of ordinary skill in the art appreciate that any arrangement that is calculated to achieve the same purpose may be substituted for the specific embodiments disclosed. This disclosure is intended to cover any and all adaptations or variations of the present invention, and it is to be understood that the terms used in the following claims should not be construed to limit the invention to the specific embodiments disclosed in the specification. Rather, the scope of the invention is to be determined entirely by the following claims, which are to be construed in accordance with the established doctrines of claim interpretation, along with the full range of equivalents to which such claims are entitled.

What is claimed is:

1. A storage system comprising:
a first node including a first processor; and
a plurality of second nodes coupled to the first node, each of the plurality of second nodes including a second processor and one or more second storage devices;
wherein the first processor is configured to control to store data and replication of the data in the second storage devices of two or more second nodes; and
wherein if at least one of the second nodes has failed and a storage capacity of the plurality of second nodes is below a given threshold, one of the second nodes is configured to receive a first data, which is replication of data stored in a failed second node, from another of the second nodes, and create parity data based on the received first data.

2. The storage system according to claim 1,
wherein the first node is configured to determine, based on the storage capacity, a coding mode for the second nodes;
wherein if the storage capacity is below a first threshold and above a second threshold which is lower than the first threshold, the coding mode is a first coding mode of parity between re-replicated data from multiple second nodes;
wherein if the storage capacity is below the second threshold and above a third threshold which is lower than the second threshold, the coding mode is a second coding mode of parity with existing replication data; and
wherein if the storage capacity is at or above a fourth threshold equal to or higher than the first threshold, the coding mode is a normal coding mode under which the second node which has created parity data is configured to restore data, which were used to create the parity data, to the other second nodes.

3. The storage system according to claim 1,
wherein the first node is configured to issue a first write request to a first target second node to store primary data and, if the first target second node cannot store the primary data or the first target second node has failed, issue the first write request to another first target second node to store the primary data; and
wherein the first node is configured to issue a second write request to a second target second node to store mirror data corresponding to the primary data and, if the second target second node cannot store the mirror data or the second target second node has failed, issue the second write request to another second target second node to store the mirror data.

4. The storage system according to claim 1,
wherein the first node is configured to determine, based on the storage capacity, a coding mode for the second nodes;
wherein if the storage capacity is below a first threshold and above a second threshold which is lower than the first threshold, the coding mode is a first coding mode of parity between re-replicated data from multiple second nodes; and
wherein if the coding mode is the first coding mode, the second node which has received the first data is configured to receive a second data, which is replication of data stored in a failed second node, and to create parity data based on the received first data and second data.

5. The storage system according to claim 1,
wherein the first node is configured to determine, based on the storage capacity, a coding mode for the second nodes;
wherein if the storage capacity is below a first threshold and above a second threshold which is lower than the first threshold, the coding mode is a first coding mode of parity between re-replicated data from multiple second nodes;
wherein if the storage capacity is below the second threshold, the coding mode is a second coding mode of parity with existing replication data; and
wherein if the coding mode is the second coding mode, the second node which receives the first data includes an existing third data which is replication of data stored in another second node, and is configured to create parity data based on the received first data and the existing third data, to overwrite the existing third data with the created parity data, and to delete the received first data from the another of the second nodes.

6. The storage system according to claim 1,
wherein the first node is configured to issue a first write request to a first target second node to store primary data;
wherein the first target second node is configured to replicate the primary data to the second node which stores the received first data; and
wherein the second node which stores the received first data is configured to create parity data between the received first data and the replicated primary data.

7. The storage system according to claim 1,
wherein the first node is configured to issue a first read request to a first target second node which stores non-parity data of the read request; and
wherein, if the first target second node cannot access the non-parity data or the first target second node has failed, the first node is configured to search a second target second node which stores parity data created using the non-parity data, and the second target second node is configured to issue a second read request to a destination second node which has parity restore data for the parity data, to receive the parity restore data from the destination second node, and to restore recovery data between the received parity restore data from the destination second node and the parity data.

8. A method for managing data storage in a storage system which includes a first node having a first processor and a plurality of second nodes coupled to the first node, each of the plurality of second nodes having a second processor and one or more second storage devices, the method comprising:
controlling to store data and replication of the data in the second storage devices of two or more second nodes; and
if at least one of the second nodes has failed and a storage capacity of the plurality of second nodes is below a given threshold, receiving by one of the second nodes a first data, which is replication of data stored in a failed second node, from another of the second nodes, and creating parity data based on the received first data.

9. The method according to claim 8, further comprising:
determining, based on the storage capacity, a coding mode for the second nodes;
wherein if the storage capacity is below a first threshold and above a second threshold which is lower than the first threshold, the coding mode is a first coding mode of parity between re-replicated data from multiple second nodes;
wherein if the storage capacity is below the second threshold and above a third threshold which is lower than the second threshold, the coding mode is a second coding mode of parity with existing replication data; and
wherein if the storage capacity is at or above a fourth threshold equal to or higher than the first threshold, the coding mode is a normal coding mode under which the second node which has created parity data is configured to restore data, which were used to create the parity data, to the other second nodes.

10. The method according to claim 8, further comprising:
issuing, by the first node, a first write request to a first target second node to store primary data and, if the first target second node cannot store the primary data or the first target second node has failed, issuing the first write request to another first target second node to store the primary data; and
issuing, by the first node, a second write request to a second target second node to store mirror data corresponding to the primary data and, if the second target second node cannot store the mirror data or the second target second node has failed, issuing the second write request to another second target second node to store the mirror data.

11. The method according to claim 8, further comprising:
determining, based on the storage capacity, a coding mode for the second nodes, wherein if the storage capacity is below a first threshold and above a second threshold which is lower than the first threshold, the coding mode is a first coding mode of parity between re-replicated data from multiple second nodes; and
if the coding mode is the first coding mode, receiving, by the second node which has received the first data, a second data, which is replication of data stored in a failed second node, and creating parity data based on the received first data and second data.

12. The method according to claim 8, further comprising:
determining, based on the storage capacity, a coding mode for the second nodes; wherein if the storage capacity is below a first threshold and above a second threshold which is lower than the first threshold, the coding mode is a first coding mode of parity between re-replicated data from multiple second nodes; wherein if the storage capacity is below the second threshold, the coding mode is a second coding mode of parity with existing replication data; and if the coding mode is the second coding mode, creating, by the second node which receives the first data and includes an existing third data which is replication of data stored in another second node, parity data based on the received first data and the existing third data, overwriting the existing third data with the created parity data, and deleting the received first data from the another of the second nodes.

13. The method according to claim 8, further comprising:
issuing, by the first node, a first write request to a first target second node to store primary data;

replicating, by the first target second node, the primary data to the second node which stores the received first data; and creating, by the second node which stores the received first data, parity data between the received first data and the replicated primary data.

14. The method according to claim 8, further comprising:
issuing, by the first node, a first read request to a first target second node which stores non-parity data of the read request; and if the first target second node cannot access the non-parity data or the first target second node has failed, searching, by the first node, a second target second node which stores parity data created using the non-parity data; and issuing, by the second target second node, a second read request to a destination second node which has parity restore data for the parity data, receiving the parity restore data from the destination second node, and restoring recovery data between the received parity restore data from the destination second node and the parity data.

15. A non-transitory computer-readable storage medium storing a plurality of instructions for managing data storage in a storage system which includes a first node having a first processor and a plurality of second nodes coupled to the first node, each of the plurality of second nodes having a second processor and one or more second storage devices, the plurality of instructions comprising:

instructions that cause the first processor to control to store data and replication of the data in the second storage devices of two or more second nodes; and instructions that, if at least one of the second nodes has failed and a storage capacity of the plurality of second nodes is below a given threshold, cause the second processor of one of the second nodes to receive a first data, which is replication of data stored in a failed second node, from another of the second nodes, and create parity data based on the received first data.

\* \* \* \* \*